(12) United States Patent
Fox et al.

(10) Patent No.: US 8,102,724 B2
(45) Date of Patent: Jan. 24, 2012

(54) SETTING CONTROLLER VREF IN A MEMORY CONTROLLER AND MEMORY DEVICE INTERFACE IN A COMMUNICATION BUS

(75) Inventors: Benjamin A Fox, Rochester, MN (US); William P Hovis, Rochester, MN (US); Thomas W Liang, Rochester, MN (US); Paul Rudrud, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 539 days.

(21) Appl. No.: 12/361,719

(22) Filed: Jan. 29, 2009

(65) Prior Publication Data

US 2010/0188918 A1 Jul. 29, 2010

(51) Int. Cl.
G11C 7/00 (2006.01)
(52) U.S. Cl. .................... 365/198; 365/189.09
(58) Field of Classification Search ............... 365/198, 365/189.09
See application file for complete search history.

(56) References Cited

U.S. PATENT DOCUMENTS

| | | | |
|---|---|---|---|
| 6,049,221 A | 4/2000 | Ishibashi et al. | |
| 6,130,836 A * | 10/2000 | Matsubara et al. | ...... 365/185.03 |
| 6,330,194 B1 | 12/2001 | Thomann et al. | |
| 6,414,525 B2 | 7/2002 | Urakawa | |
| 6,639,423 B2 | 10/2003 | Martin et al. | |
| 6,762,614 B2 | 7/2004 | Rearick et al. | |
| 6,807,650 B2 | 10/2004 | Lamb et al. | |
| 6,958,942 B2 | 10/2005 | Chang | |
| 7,362,622 B2 | 4/2008 | Braun et al. | |
| 7,411,407 B2 | 8/2008 | Rearick et al. | |
| 7,439,761 B2 | 10/2008 | Mayer et al. | |
| 7,489,160 B2 | 2/2009 | Kimura | |
| 7,514,954 B2 | 4/2009 | Kim et al. | |
| 7,515,487 B2 | 4/2009 | Seo et al. | |
| 7,593,272 B2 | 9/2009 | Doyle et al. | |
| 7,710,144 B2 * | 5/2010 | Dreps et al. | ...................... 326/30 |
| 7,848,175 B2 | 12/2010 | Fox et al. | |
| 2002/0149972 A1 * | 10/2002 | Lamb et al. | ............... 365/189.09 |
| 2008/0272800 A1 | 11/2008 | Haig et al. | |
| 2010/0188908 A1 | 7/2010 | Fox et al. | |
| 2010/0188917 A1 | 7/2010 | Fox et al. | |
| 2010/0188919 A1 | 7/2010 | Fox et al. | |
| 2010/0192000 A1 | 7/2010 | Fox et al. | |

OTHER PUBLICATIONS

Notice of Allowance issued for U.S. Appl. No. 12/361,976, mail date Jul. 30, 2010, 7 pp.
JEDEC Standard; POD18—1.8 V Pseudo Open Drain I/O; JESD8-19 Datasheet [online]. JEDEC Solid State Technology Association, 2006 [retrieved on Mar. 12, 2008]. Retrieved from the Internet: <URL: http://www.jedec.org/download/search/JESD8-19.pdfl>.
Non-Final Office Action for U.S. Appl. No. 12/361,577 mailed Oct. 13, 2010, 10 pp.
Notice of Allowance issued for U.S. Appl. No. 12/361,592, mail date Feb. 25, 2011, 14 pp.
Notice of Allowance issued for U.S. Appl. No. 12/361,602, mail date Mar. 3, 2011, 14 pp.

(Continued)

Primary Examiner — Tuan T. Nguyen
(74) Attorney, Agent, or Firm — Toler Law Group

(57) ABSTRACT

A memory device is connected through an interface to a memory controller. The controller's reference voltage is set based on a driver's impendence of the memory device during driver training. The voltage is applied to a reference resistor pair at the controller and changed until the voltage level switches. The voltage is then set at the reference resistor pair of the controller.

20 Claims, 5 Drawing Sheets

OTHER PUBLICATIONS

JEDEC Standard; POD18—1.8 V Pseudo Open Drain I/O; JESD8-19 Datasheet [online]. JEDEC Solid State Technology Association, Dec. 2006 [retrieved Mar. 12, 2008 from the Internet at <www.jedec.org/download/search/JESD8-19.pdf> (14 pgs).

* cited by examiner

SETTING CONTROLLER VREF IN A MEMORY CONTROLLER AND MEMORY DEVICE INTERFACE IN A COMMUNICATION BUS

RELATED APPLICATIONS

The present application relates to co-pending U.S. patent applications, entitled "Setting Controller Termination in a Memory Controller and Memory Device Interface in a Communication Bus" Ser. No. 12/361,836, "Calibration of Memory Driver with Offset in a Memory Controller and Memory Device Interface in a Communication Bus" Ser. No. 12/361,976, "Setting Memory Controller Driver to Memory Device Termination Value in a Communication Bus" Ser. No. 12/361,577, "Setting Memory Device Vref in a Memory Controller and memory Device Interface in a Communication Bus" Ser. No. 12/361,592, and "Setting Memory Device Termination in a Memory Device and Memory Controller Interface in a Communications Bus" Ser. No. 12/361,602, by the present inventors, Paul W. Rudrud, Thomas W. Liang, Benjamin A. Fox, and William P. Hovis. The co-pending applications are filed concurrently herewith, and are incorporated by reference in their entireties.

FIELD OF THE INVENTION

This invention relates to a device and method in which a memory device such as a DRAM and a memory controller are coupled during memory driver training to reduce mismatches by adjusting the reference voltage. The invention further relates to conducting such adjustment to yield improvements in timing margins to remove known offset issues.

BACKGROUND OF THE INVENTION

In an electrical communication bus in which a memory controller is coupled with a memory device such as GDDR3 DRAM memory, the DRAMs are designed to train their drive impedance and termination values against a reference resistor. However, process variations and resolution may cause variations in the final DRAM training values. The variations may occur within a memory controller coupled to the DRAM if it trains in a similar manner, thereby causing a mismatch in DRAM and controller impedances.

The mismatch may cause timing offsets due to reference voltages not being properly aligned to the resulting data eye. The problem is described as occurring specifically in a GDDR3 interface from a memory controller to a GDDR3 memory device. However, the problem also occurs in a number of other system and sub-system electrical communication buses, resulting in reduced timing margins in other such situations.

Accordingly, what is needed is an arrangement which couples a memory device and its memory controller during memory driver training to reduce mismatches by adjusting the reference voltage to improve the timing margins.

SUMMARY OF THE INVENTION

The present invention provides for a memory device and memory controller, typically a DRAM memory device and more particularly, a GDDR3 memory device to be coupled during driver training to reduce mismatches by adjusting the reference voltage to yield improvements in timing margins.

According to an aspect of the invention, a method of training the controller's vref based on the memory device's driver and the controller's termination, with the memory device connected to a memory controller, is provided in an electrical communication bus. The memory device is coupled in an electrical communication bus, typically through a data net, with a corresponding memory controller during training of the driver impedance of the memory device. The memory controller's reference voltage is set based on a driver impedance of the memory device and the controller's termination. The Vlow reference voltage is applied to the reference resistor arrangement. The voltage is changed at the reference resistor arrangement while monitoring a test path in the memory controller. When the test path just switches its value, the voltage is set for the reference resistor arrangement. Optionally, the reference resistor arrangement is a pair of resistors.

Another aspect provides for a standard up/down terminated signal received at the memory controller from the memory device. The method includes adjusting both a Vhigh reference voltage and a Vlow reference voltage of the memory controller, respectively, to general the optimum Vref voltage.

Embodiments of the invention include the memory device as a GDDR3 DRAM. The memory controller provides a GDDR3 interface through a data net connection.

Another aspect of the invention includes a coupled memory controller and memory device in an electrical communication bus. A connection is provided between a memory interface of the memory controller to the memory device typically through a data net. The memory controller is programmed to read a voltage from the memory device. A reference resistor arrangement is connected to a Vlow reference voltage of the memory controller. The Vlow reference voltage is connected to a D/A voltage of the memory controller. The memory controller is programmed for monitoring the test path voltage while changing the D/A voltage for setting the reference voltage when the test path voltage switches from one level to another level.

Embodiments include the test path being a first test path with a first D/A voltage for reading a "0," and further including a second test path with a second D/A voltage connected thereto for reading a "1." The data net may be set as a "0" level, and the data net may be set as a "1" level. In a further exemplary embodiment, the system is configured such that when the first test path voltage changes from one level to another the Vlow reference voltage is set, and when the second test path voltage changes from one level to another level, the Vhigh reference voltage is set.

These and other advantages and features that characterize the invention are set forth in the claims annexed hereto and forming a further part hereof. However, for a better understanding of the invention, and of the advantages and objectives obtained through its use, reference should be made to the Drawings and to the accompanying descriptive matter in which there are described exemplary embodiments of the invention.

DETAILED DESCRIPTION OF THE INVENTION

In one aspect, embodiments consistent with the invention may capitalize on the ability to couple a memory device such as a DRAM and a memory controller during driver training to reduce mismatches by adjusting the reference voltage to yield improvements in timing margins. In more general terms, coupling the components on a shared electrical bus through level adjustment dramatically removes known offset issues. Further, while embodiments of the invention are described specifically for a GDDR3 interface from a memory controller to a GDDR3 memory device, the system and method described may be applied to any number of system and sub-system electrical communication busses. Optionally, this may be applied where controller termination 199 (upper left box) already exists, shown in FIG. 1. This feature provides advances over the prior art illustrated in FIG. 1 by reducing the resulting signal errors. Optionally, the speed at which the interface operates may be improved as a result of employing the system and method described.

Figure 1:
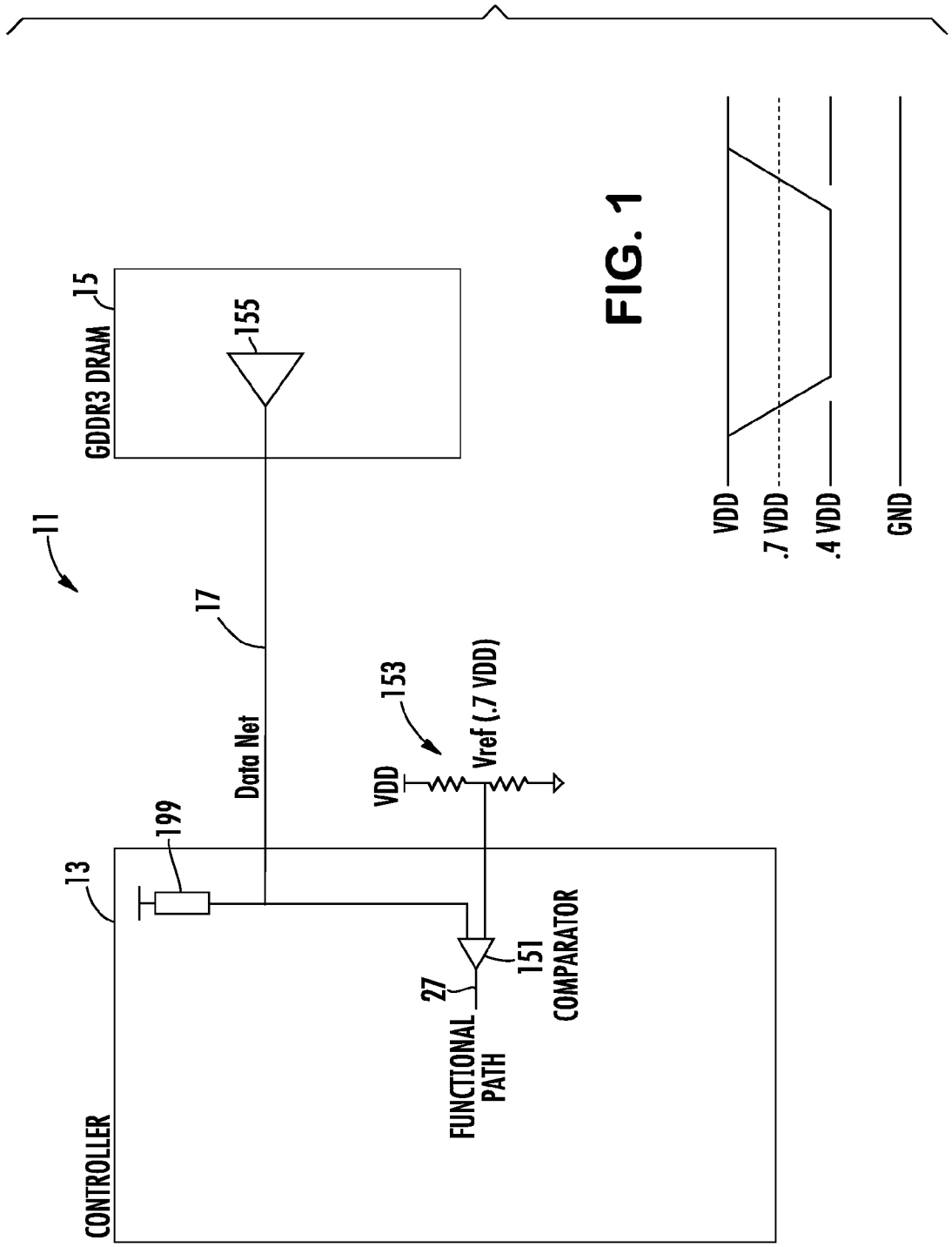
FIG. 1 is a schematic diagram illustrating a typical prior art interface in an electrical communication bus between a memory controller and a memory device, such as a GDDR3 SDRAM.

Turning more particularly to the drawings, FIG. 1 shows a typical GDDR3 interface. In the system 11, a memory controller 13 is connected through a data net 17 to a GDDR3 DRAM 15. The data net 17 connects to a functional path 27 in the memory controller 13 connected to a comparator 151, and a termination device 199. The reference voltage for the comparator 151 is typically provided through a voltage divider pair of resistors 153.

Figure 2:
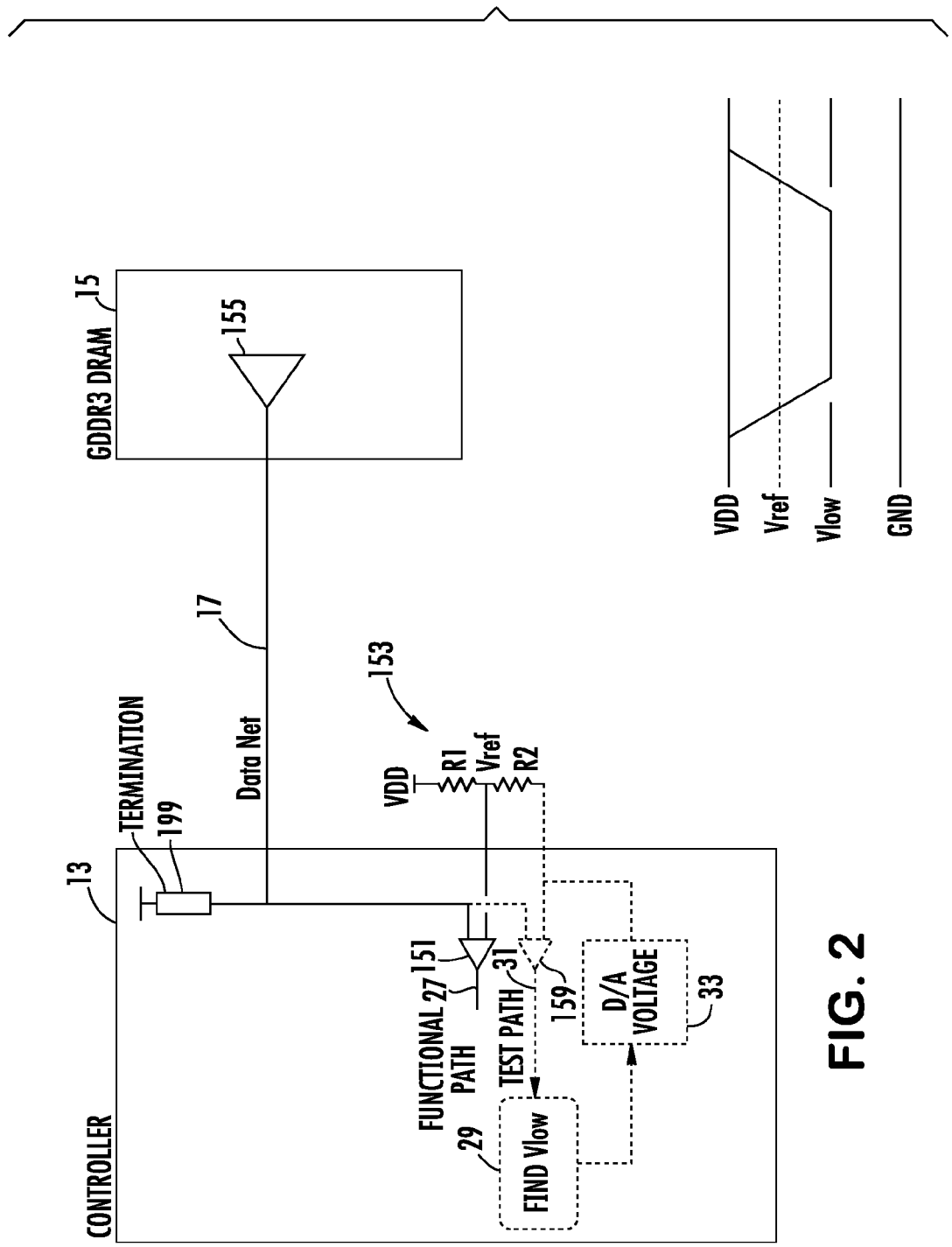
FIG. 2 is a schematic diagram of one embodiment of the invention for coupling a memory device and memory controller during driver training to reduce mismatches.

In one embodiment, the invention is generally shown by the system 11 illustrated in FIG. 2. When a GDDR3 DRAM 15 drives a 0 level value (reading a 0), i.e., the DRAM 15 driver 155 is initialized by setting a "0" bit, the impedances of both the DRAM driver 155 and controller 13 termination 199 determines what the voltage of the "0" level will be on the data net 17. In order to obtain the greatest timing margin on the data interface through the data net 17, embodiments address any variations in impedances. By modifying the reference voltages, the maximum timing margins may be obtained. In accordance with an embodiment of the invention, no modification to the GDDR3 DRAM 15 is required.

In this exemplary embodiment, the controller 13 reference voltage is set based upon the independently trained DRAM 15 and the controller 13 termination value at termination device 199. More particularly, a level "0" is read to establish the "0" level (Vlow).

In the embodiment of FIG. 2, a voltage is created and applied to one resistor R2 of a pair 153 of matched resistors R1 and R2. R1 is connected to VDD and the divided voltage Vref is halfway between the voltage (Vlow) created by a D/A device 33 and the VDD. The system 11 operates such that the controller 13 increments or decrements the D/A device 33 voltage which is seen at a low test path comparator 159 while monitoring a test path 31 to find Vlow. More specifically, a detector 29 monitors a test path 31 such that when the test path 31 just switches from a level 0 to a level 1, or from a level 1 to a level 0, the voltage is set correctly and therefore Vref is set halfway between the low "0" value and VDD. In this embodiment, the resistors R1 and R2 are unique as compared to resistors on typical GDDR3 controller which are not a matched pair.

In this exemplary embodiment, there is a single adjustment for every GDDR3 device, and driver-to-driver variations within a single device may be ignored. If multiple devices are implemented on the same interface pins, then an adjustment must be made for each one, and duplication of circuitry or pins is required. More particularly, with duplicate devices on the same electrical interface, the level associated with each device must be multiplexed when data from the device is being received. Since each tuning may be done independently, much of what is shown in FIG. 2 may be common for all independently selectable elements. In an alternative implementation, tuning may be done on elements with common circuits and stored values for each independent bus, device or even I/O interface, if desired.

Figure 4:
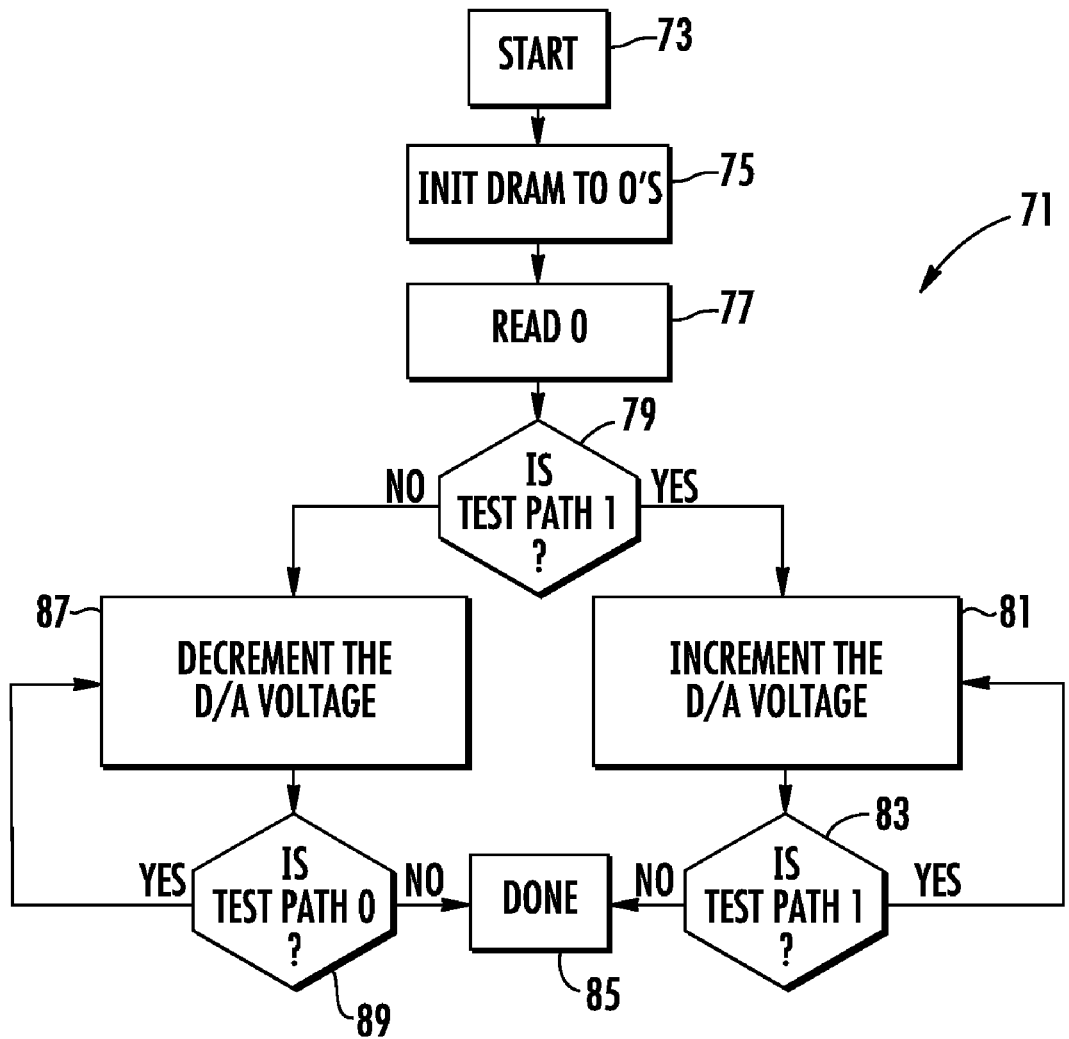
FIG. 4 is a flow diagram illustrating the operation during matching of the memory controller and memory device of FIG. 2.

Referring to FIG. 4, setting of the controller Vref in accordance with a system such as that of FIG. 2 is illustrated in greater detail in the flow chart 71 shown. The process commences at step 73 and a portion (or all) of the DRAM's data is initialized 75 (or written) to all "0's". The controller 13 reads 77 the initialized 0's on the data net 17. The detector 29 determines if the test path is set 79 at a level "1." If a "1" is seen, indicating that Vlow is too low, the D/A voltage is incremented 81 and again a determination 83 is made about whether the D/A voltage is set so that the detector sees the test path at a level "1". If yes, D/A voltage is again incremented 81 until the test path is not a level 1, and the process ends 85.

On the other side of the flow chart 71, if the test path is not a 1, then the D/A voltage is decremented 87 and a check is made 89 to determine whether the test path is a level 0. If it is level 0, the D/A voltage is again decremented until the test path is no longer at level 0, at which time the adjustment is complete 85.

Figure 3:
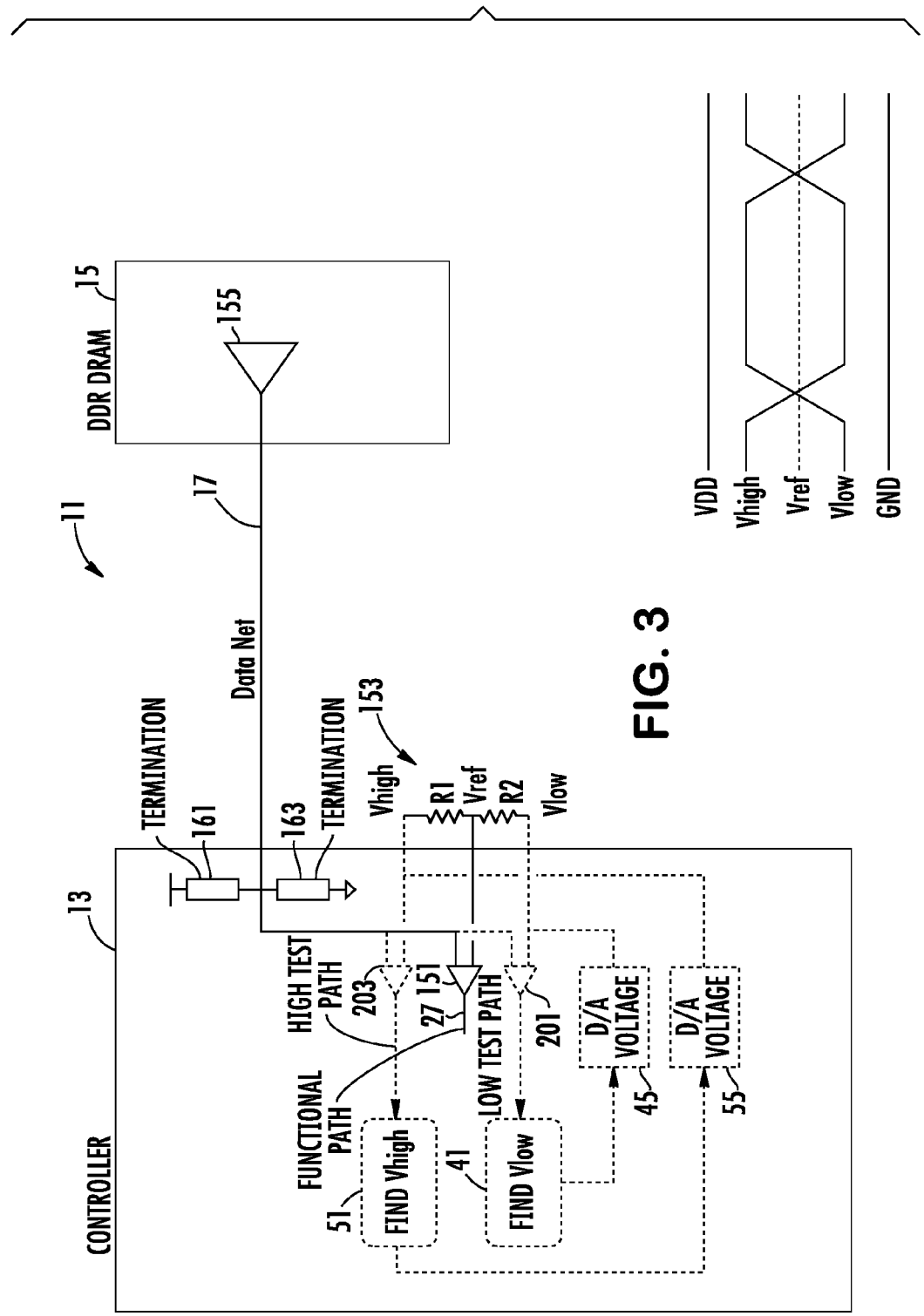
FIG. 3 is a second embodiment illustrating a connection between a memory device and a memory controller for coupling the memory and memory controller during driver training to reduce mismatches.

In an alternative embodiment illustrated in FIG. 3, an interface is provided for the system 11 in which both the high and low levels are adjusted and saved independently, where neither low or high level is at a power supply value. This architecture is useful in many midpoint Vref bus structures that are terminated and do not achieve full rail values. It is possible that the resistors R1 and R2 at resistor pairs 153 are a matched pair but are not the same as resistors on a typical controller. The controller 13 includes high and low termination devices 161 and 163. In this embodiment, the DDR devices are generally wide in nature, for example, ×32, but may occasionally be employed with two devices on the same electrical interface. Other interfaces may be either exclusively point to point or may allow multiple loads like a memory controller to 3 or 4 DDR DRAM devices.

In this embodiment, initially a 0 level is read on the data net 17. A reference voltage for comparator 151 is again set, typically through a voltage divider pair of resistors 153. A D/A device 45 creates a Vlow voltage. The difference between the read "0" on data net 17 and Vlow is observed on a low test comparator 201 output or "low test path." If a 0 is observed on the comparator 201 output, Vlow was set too high. A "Find Vlow" logic 41 then instructs the D/A device 45 to incrementally generate lower Vlow voltages until the "Find Vlow" logic 41 sees a 1 on the test path. At this point, the Vlow voltage generated by the D/A device 45 would have the same voltage (or very close to) as the voltage on the data net 17.

A similar operation is conducted on the Vhigh side of the controller 13. At this time, a 1 level is read on the data net 17. A D/A device 55 creates a Vhigh voltage. The difference between the read "1" on the data net 17 and Vhigh is observed on a high test path comparator 203 output or "high test path." If a 1 is observed on the comparator 203 output, Vhigh was set too low. A "Find Vhigh" logic 51 then instructs the D/A device 55 to incrementally generate higher Vhigh voltages until the "Find Vhigh" logic 51 sees a 0 on the high test path. At this point, the Vhigh voltage generated by the D/A device 55 would have the same voltage (or very close to) as the voltage on the data net 17.

Both the Vhigh and Vlow voltages are set in the manner illustrated generally in the timing diagram between VDD and ground as shown in FIG. 3 in the lower right corner.

Figure 5:
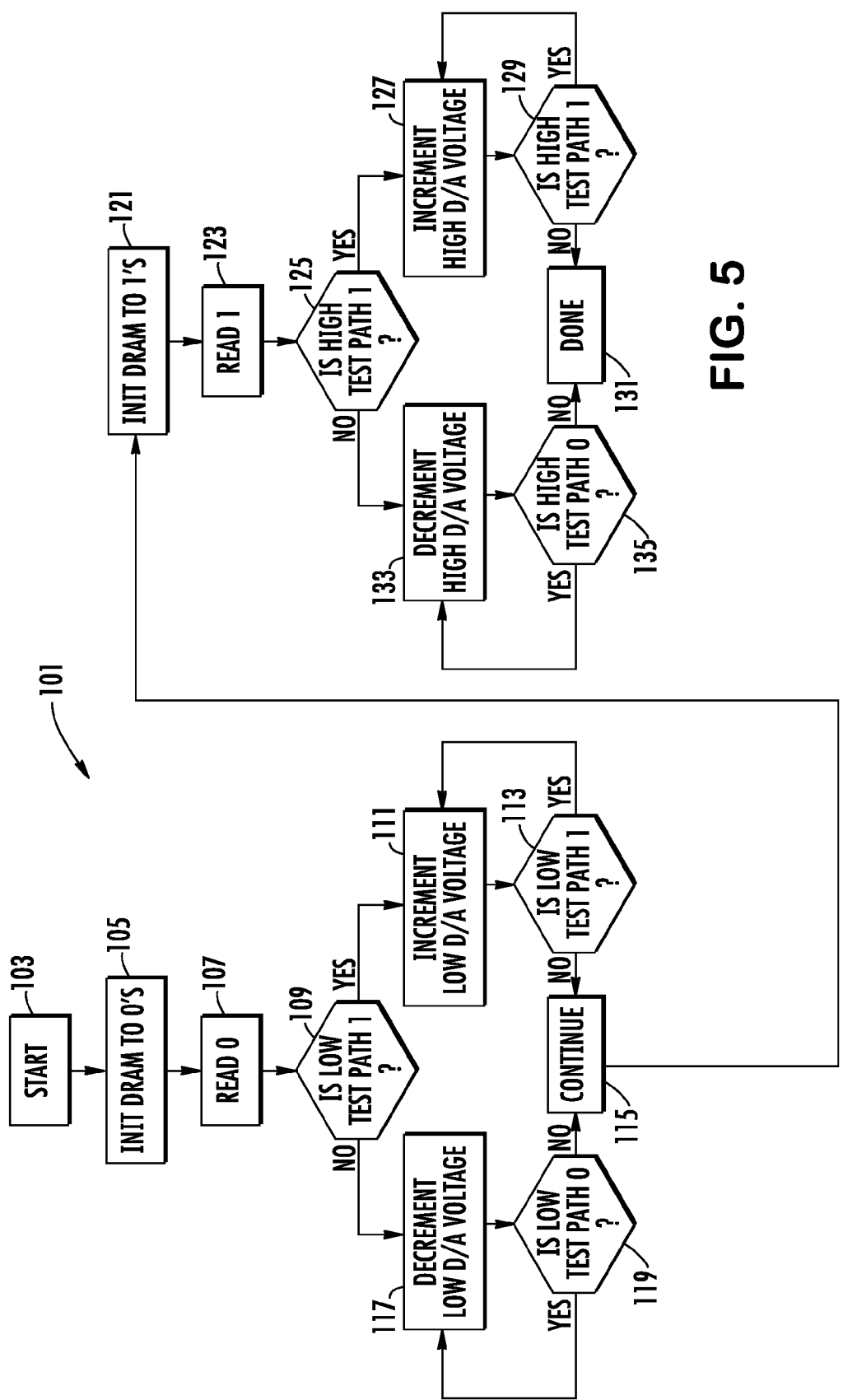
FIG. 5 is a flow diagram illustrating the operation during matching of the memory controller and memory device of FIG. 3.

The flow chart 101 of FIG. 5 illustrates how to implement a method in a system such as that shown in FIG. 3. In order to set the Vlow, the process initiates 103 and the DRAM is initialized 105 (written) to "0"s 105. A "0" is read 107. It is determined 109 if the low test path is at a level 1. If a 1 is seen, the D/A voltage is incremented 111 and it is again determined 113 if the test path voltage continues to be too low. The voltage continues to be incremented until a change in level occurs, at which time the process ends 115 with respect to Vlow.

On the other side of the flow chart, if a 0 is seen, the low D/A voltage is decremented 117 and then tested 119. Decrementing of the voltage continues until the Vlow is set at the right level.

After setting the Vlow value, the DRAM is initialized 121 (written) to "1"s. A 1 is read 123 and it is determined if Vhigh is too low 125. If Vhigh is determined to be too low (highest path is at a 1), the high D/A voltage is incremented 127 and the high test path is again tested 129. If it is still too low, it is again incremented 127 until a change on the high test path occurs and the process terminates 131. If the high test path is seen 125 as a 0, the D/A voltage is decremented 133, and again the high test path is observed 135 to determine if Vhigh is too high. This continues until a change in level occurs at which time the process terminates 131.

Other application variables may play a role in the optimal training of the interface relative to the appropriate high, low and Vref levels. Impedance or termination values may vary with temperature and/or voltage level variations associated with activity on other system or sub-system resources. The calibration in accordance with the invention may be either repeated as conditions change for maintenance of optimal settings and performance or unique settings may be saved for different conditions if desired. In one exemplary embodiment, a temperature change of greater than 20 degrees celsius from the original or last calibration may trigger initiation of a new calibration, or may trigger the loading of an alternate set of previously stored calibration values associated with the new temperature.

While the invention is shown for a GDDR3 device and memory controller system, it will be apparent to those of ordinary skill that the methods herein may be applied to other industry standard or proprietary interfaces without deviating from the general methods disclosed. Thus, the invention in its broader aspects is therefore not limited to the specific details, representative apparatus and method, as shown and described. Accordingly, departures may be made from such details without departing from the spirit or scope of Applicant's general inventive concept.

What is claimed is:

1. A method of training the drive impedance of a memory device against a reference resistor arrangement connected to a memory controller in an electrical communication bus, comprising:
    connecting a memory device in an electrical communication bus with a corresponding memory controller during training of the drive impedance of the memory device;
    setting the memory controller's reference voltage based on a driver impedance of the memory device;
    applying the reference voltage to said reference resistor arrangement;
    changing the voltage at the reference resistor arrangement while monitoring a test path in the memory controller; and
    when the voltage on the test path just switches its value, retaining the voltage at the reference resistor arrangement.

2. The method of claim 1, wherein said reference resistor arrangement comprises a pair of matched resistors connected to VDD with a voltage divided Vref for the memory controller halfway between a D/A voltage of the memory controller and VDD, and further comprising changing the D/A voltage while monitoring the test path.

3. The method of claim 1, wherein said memory device is a GDDR3 DRAM, and further comprising setting the DRAM voltage at a level value of 0, reading the 0 from the DRAM to establish the voltage Vlow for the 0 level, applying the Vlow voltage to one of a pair of matched resistors; changing the voltage at the memory controller, and monitoring a test path until the test path voltage value just switches its level.

4. The method of claim 1, wherein said memory device is a GDDR3 memory device.

5. The method of claim 1, wherein said adjustment is conducted in a manner to find the Vlow level on the test path.

6. The method of claim 4, wherein said voltage received from said memory device is read as a level 0.

7. The method of claim 1, further comprising receiving a high and a low voltage level at the memory controller from the memory device; and wherein said adjusting further comprises adjusting a high reference voltage and a low reference voltage of the memory controller respectively, to match the memory device and memory controller impedance to each other.

8. The method of claim 7, wherein the high voltage level is set at a 1 and the low voltage level is set at a 0.

9. The method of claim 8, further comprising applying the high reference voltage to said reference resistor arrangement, changing the voltage at the reference resistor arrangement while monitoring a high reference voltage test path in the memory controller, and when the test path switches its value, setting the voltage at the reference resistor arrangement.

10. A method of training the drive impedance of a memory device against a pair of reference resistor arrangement, the memory device connected to a memory controller in an electrical communication bus, comprising:
    connecting a memory device in an electrical communication bus with a corresponding memory controller during training of the drive impedance of the memory device;
    setting a Vlow reference voltage of the memory controller based on a Vlow driver impedance of the memory device;
    applying the Vlow reference voltage to said pair of reference resistors;
    changing the Vlow voltage at the reference resistor arrangement while monitoring a first test path in the memory controller;
    when the voltage on the first test path just switches its value, setting the Vlow voltage at the of resistor arrangement;
    setting a Vhigh reference voltage of the memory controller based on a Vhigh driver impedance of the memory device;
    applying the Vhigh reference voltage to said reference resistor arrangement;
    changing the Vhigh voltage at the reference resistors arrangement while monitoring a second test path in the memory controller; and when the voltage on the second test path just switches its value, setting the Vhigh voltage at the reference resistor arrangement.

11. A coupled memory controller and memory device in an electrical communication bus, comprising:
    a connection between a memory interface of the memory controller to the memory device, and the memory controller programmed to read a voltage level from the memory device;
    a reference resistor arrangement connected to a test path of the memory controller, said test path being connected to a D/A voltage of said memory controller; and
    said memory controller being programmed for monitoring the test path voltage while changing the D/A voltage for setting the reference voltage when the test path switches from one voltage level to another voltage level.

12. The device of claim 11, wherein said memory device is configured for reading a low reference voltage through said connection.

13. The device of claim 11, wherein said memory device is configured for reading a low reference voltage and a high reference voltage through said connection.

14. The device of claim 13, wherein said test path is a first test path with a first D/A voltage for reading a low reference voltage, and further comprising a second test path with a second D/A voltage connected thereto for reading a high reference voltage.

15. The device of claim 14, wherein said memory device is configured for reading a low reference voltage from said memory device as a 0 level, and for reading a high reference voltage from said memory device as a 1 level.

16. The device of claim 14, wherein said memory controller is programmed for changing and monitoring the first test path voltage level while changing the first D/A voltage level for setting the low reference voltage when the first test path voltage changes from one level to another, and for changing and monitoring the second test path voltage level while changing the second D/A voltage level for setting the high reference voltage when the second test path voltage changes from one level to another.

17. The device of claim 16, wherein said voltage levels are respectively one of a 0 and a 1.

18. The device of claim 16, wherein said changing of voltage level is one of incrementing and decrementing the voltage.

19. The device of claim 11, wherein said memory device is a GDDR3 DRAM.

20. The device of claim 11, wherein said memory device is a GDDR3 memory device.

\* \* \* \* \*